US008232350B2

(12) United States Patent
Fujita et al.

(10) Patent No.: US 8,232,350 B2
(45) Date of Patent: Jul. 31, 2012

(54) ADHESIVE ENCAPSULATING COMPOSITION AND ELECTRONIC DEVICES MADE THEREWITH

(75) Inventors: Jun Fujita, Kanagawa (JP); Nami Kobori, Kanagawa (JP); Vivek Bharti, Cottage Grove, MN (US); Fred B. McCormick, Maplewood, MN (US); Serena L. Mollenhauer, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 12/995,565

(22) PCT Filed: Apr. 28, 2009

(86) PCT No.: PCT/US2009/041918
§ 371 (c)(1),
(2), (4) Date: Dec. 1, 2010

(87) PCT Pub. No.: WO2009/148722
PCT Pub. Date: Dec. 10, 2009

(65) Prior Publication Data
US 2011/0105637 A1    May 5, 2011

Related U.S. Application Data

(60) Provisional application No. 61/058,066, filed on Jun. 2, 2008.

(51) Int. Cl.
| C08F 8/00 | (2006.01) |
| C08L 33/02 | (2006.01) |
| C08L 33/04 | (2006.01) |
| C08L 35/02 | (2006.01) |
| C08K 5/00 | (2006.01) |

(52) U.S. Cl. ......... 525/191; 525/193; 525/221; 525/222
(58) Field of Classification Search .................. 525/191, 525/193, 221, 222; 524/515
See application file for complete search history.

(56) References Cited

U.S. PATENT DOCUMENTS

| 3,657,149 A | 4/1972 | Vandenberg |
| 3,657,159 A | 4/1972 | Vandenberg |
| 4,822,350 A | 4/1989 | Ito et al. |
| 5,107,175 A | 4/1992 | Hirano et al. |
| 5,238,519 A | 8/1993 | Nath et al. |
| 5,728,230 A | 3/1998 | Komori et al. |
| 6,226,890 B1 | 5/2001 | Boroson et al. |
| 6,384,315 B1 | 5/2002 | Yamagishi et al. |
| 6,835,950 B2 | 12/2004 | Brown et al. |
| 7,018,713 B2 | 3/2006 | Padiyath et al. |
| 7,279,777 B2 | 10/2007 | Bai et al. |
| 7,352,038 B2 | 4/2008 | Kelley et al. |
| 7,923,480 B2 | 4/2011 | Fujita et al. |
| 2004/0119403 A1 | 6/2004 | McCormick et al. |
| 2005/0147813 A1 | 7/2005 | Gotz et al. |
| 2005/0227082 A1 | 10/2005 | Shimazu et al. |
| 2005/0266239 A1 | 12/2005 | Satake |
| 2006/0022592 A1 | 2/2006 | Boroson |
| 2006/0041093 A1 | 2/2006 | Ravikiran et al. |
| 2006/0063015 A1 | 3/2006 | McCormick et al. |
| 2008/0050552 A1 | 2/2008 | Ahn et al. |
| 2009/0026934 A1 | 1/2009 | Fujita et al. |
| 2010/0155247 A1 | 6/2010 | Cao et al. |
| 2011/0073901 A1 | 3/2011 | Fujita et al. |

FOREIGN PATENT DOCUMENTS

| EP | 0 414 258 | 2/1991 |
| JP | 2005239359 | 9/1993 |
| JP | 2008231728 | 9/1996 |
| JP | 2009012586 | 1/1997 |
| JP | 2009296115 | 11/1997 |
| JP | 2003165841 | 6/2003 |
| JP | 2005-057523 | 3/2005 |
| JP | 2005-129821 | 5/2005 |
| JP | 2006-186175 | 7/2006 |
| JP | 2007-112956 | 5/2007 |
| WO | 2006/057218 | 6/2006 |

OTHER PUBLICATIONS

Japanese Industrial Standard, "Testing Methods for Determination of the Water Vapour Transmission Rate of Moisture-Proof Packaging Materials (Dish Method)" JIS Z-0208-1976.
Supplementary European Search Report, EP Application No. 09758885, dated Dec. 5, 2011.

*Primary Examiner* — Nathan M Nutter
(74) *Attorney, Agent, or Firm* — Jay Pralle

(57) ABSTRACT

Adhesive encapsulating compositions for use in electronic devices such as organic electroluminescent devices, touch screens, photovoltaic devices, and thin film transistors are disclosed herein. The adhesive encapsulating compositions include pressure sensitive adhesives comprising one or more polyisobutylene resins, in combination with optional multi-functional (meth)acrylate monomers and/or optional tackifiers.

27 Claims, 3 Drawing Sheets

ADHESIVE ENCAPSULATING COMPOSITION AND ELECTRONIC DEVICES MADE THEREWITH

CROSS REFERENCE TO RELATED APPLICATION

This application is a national stage filing under 35 U.S.C. 371 of PCT/US2009/041918, filed Apr. 28, 2009, which claims priority to U.S. Provisional Application No. 61/058,066, filed Jun. 2, 2008, the entire disclosures of which are incorporated by reference herein.

FIELD

An encapsulating adhesive composition for use in an electronic device is disclosed. More specifically, a pressure sensitive adhesive composition comprising polyisobutylene is disclosed for use with electronic devices such as organic electroluminescent devices, touch screens, photovoltaic devices, and thin film transistors.

BACKGROUND

Organic electroluminescent devices include an organic layer (hereinafter sometimes referred to as a "light-emitting unit") provided by placing organic charge transport layer(s) and organic light-emitting layers between an anode and a cathode. Electroluminescent devices often can provide high-intensity light emission while being driven by direct current and low-voltage. Electroluminescent devices have all constituent elements formed of a solid material and have the potential for being used as flexible displays.

The performance of some electroluminescent devices can deteriorate over time. For example, light emission characteristics such as light emission intensity, light emission efficiency and light emission uniformity can decrease over time. The deterioration of the light emission characteristics can be caused by oxidation of the electrode due to oxygen permeating into the organic electroluminescent device, oxidative decomposition of the organic material due to generation of heat from driving the device, corrosion of the electrode due to moisture in the air that permeates into the organic electroluminescent device, or breakdown of the organic material. Furthermore, interfacial separation of the structure may also give rise to deterioration of the light emission characteristics. The interfacial separation can result, for example, from the effects of oxygen or moisture and from the effects of heat generation while driving the device. Heat can trigger interfacial separation due to the generation of stress resulting from differences in the thermal expansion coefficients between adjacent layers.

Organic electroluminescent devices are sometimes encapsulated with a polymeric material so as to protect the device from contact with moisture and/or oxygen. However, many polymeric materials are insufficient because of their hermetic sealing properties, moisture resistance, moisture barrier properties, and the like. If a thermally curable polymeric material is used, heat is used to cure the material, which can result in deterioration of the organic light-emitting layer and/or charge transfer layer, or the light-emitting characteristics of the device can deteriorate due to crystallization. If a photocurable polymeric material is used, UV radiation is often used to cure the material, which can result in deterioration of the organic light-emitting layer and/or charge transfer layer. After the polymer material is cured, it can crack due to impact, bending, or vibrations which may occur when the device is used, and which can also lead to deterioration of the performance characteristics of the device.

SUMMARY

In one aspect, disclosed herein is an adhesive encapsulating composition for use in an electronic device, comprising: a first polyisobutylene resin having a weight average molecular weight of greater than about 300,000 g/mol; and a multifunctional (meth)acrylate monomer; wherein the adhesive encapsulating composition is substantially free of tackifier.

In another aspect, disclosed herein is an adhesive encapsulating composition for use in an electronic device, comprising: a first polyisobutylene resin having a weight average molecular weight of greater than about 300,000 g/mol; and a second polyisobutylene resin having a weight average molecular weight of less than about 100,000 g/mol, wherein the adhesive encapsulating composition is substantially free of tackifier.

In another aspect, disclosed herein is an adhesive encapsulating composition for use in an electronic device, comprising: a second polyisobutylene resin having a weight average molecular weight of less than about 300,000 g/mol; a multifunctional (meth)acrylate monomer; and a tackifier, wherein the adhesive encapsulating composition is free of a first polyisobutylene having a weight average molecular weight of greater than about 300,000 g/mol.

In another aspect, disclosed herein is an adhesive encapsulating composition for use in an electronic device, comprising: a first polyisobutylene resin having a weight average molecular weight of greater than about 300,000 g/mol, wherein the first polyisobutylene resin comprises 20 wt. % or less of the total weight of the adhesive encapsulating composition; a second polyisobutylene resin having a weight average molecular weight of less than about 300,000 g/mol; a multifunctional (meth)acrylate monomer; and a tackifier.

In some embodiments, the adhesive encapsulating compositions disclosed herein may be photopolymerizable or thermally polymerizable. In some embodiments, the adhesive encapsulating compositions may each be provided in the form of an adhesive layer disposed on a substrate.

In general, the adhesive encapsulating compositions are pressure sensitive adhesives. The adhesive encapsulating compositions may be used in electronic devices such as organic electroluminescent devices, photovoltaic devices, and thin film transistors.

These and other aspects of the invention are described in the detailed description below. In no event should the above summary be construed as a limitation on the claimed subject matter which is defined solely by the claims as set forth herein.

BRIEF DESCRIPTIONS OF DRAWINGS

DETAILED DESCRIPTION

Figure 1A:
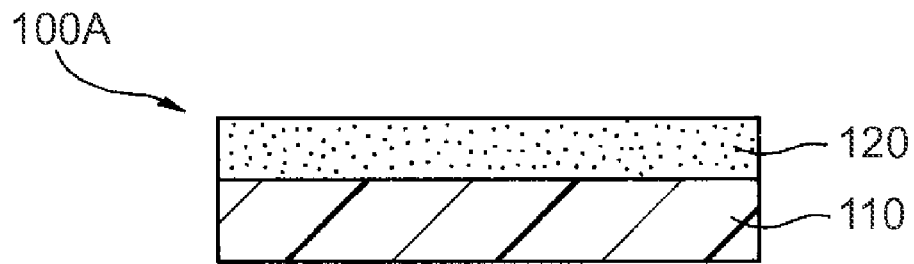
FIGS. 1A-1D show schematic cross sections of exemplary adhesive encapsulating films.

The adhesive encapsulating compositions disclosed herein may provide one or more advantages. The adhesive encapsulating compositions comprise little or no water which minimizes the adverse effects of moisture on the electronic devices. Another advantage is that they have low permeability to moisture such that exposure of the encapsulated electronic components to moisture may be prevented or minimized. The adhesive encapsulating compositions may also be designed to have little or no acidic components such that corrosion of metal components such as electrodes in the device may be prevented or minimized.

The adhesive encapsulating compositions also exhibit good adhesive properties. The adhesive encapsulating compositions have sufficient flowability such that little or no air is trapped as voids in the encapsulated electronic device. Further, the adhesive encapsulating compositions may exhibit little or no outgassing which is often a problem with adhesives used for electronic applications. The handleability of an adhesive encapsulating composition may be improved by providing the composition as a layer on a substrate to form an adhesive encapsulating film.

The adhesive encapsulating compositions may have high transmission (at least about 80%) in the visible region of the electromagnetic spectrum, the visible region having a wavelength of from about 380 nm to about 800 nm. If an adhesive encapsulating composition has such high transmission in the visible region, it can be disposed on the side of a light-emitting or light-receiving surface of an electronic device without blocking light.

In addition, the adhesive encapsulating compositions can be used in a variety of electronic devices. In such devices, generation of encapsulation defects due to impact or vibration can be minimized. One type of electronic device in which the adhesive encapsulating compositions may be used is in flexible displays. Other types of electronic devices include organic light emitting diodes, photovoltaic cells, thin film transistors, and touch screens.

In some embodiments, the adhesive encapsulating composition comprises: a first polyisobutylene resin having a weight average molecular weight of greater than about 300,000 g/mol; and a multifunctional (meth)acrylate monomer; wherein the adhesive encapsulating composition is substantially free of tackifier. The first isobutylene resin may have a weight average molecular weight of greater than about 1,000,000 g/mol. The first polyisobutylene may comprise at least about 50 wt. % of the total weight of the adhesive encapsulating composition.

In some embodiments, the adhesive encapsulating composition comprises: a first polyisobutylene resin having a weight average molecular weight of greater than about 300,000 g/mol; and a second polyisobutylene resin having a weight average molecular weight of less than about 100,000 g/mol, wherein the adhesive encapsulating composition is substantially free of tackifier. In this embodiment, the first isobutylene resin may have a weight average molecular weight of greater than about 400,000 g/mol. In this embodiment, the first isobutylene resin may also have a weight average molecular weight of greater than about 1,000,000 g/mol. The first polyisobutylene may comprise at least about 50 wt. % of the total weight of the adhesive encapsulating composition. A multifunctional (meth)acrylate monomer may also be included in the adhesive encapsulating composition of this embodiment. When such a monomer is used, the adhesive encapsulating composition may comprise: from about 50 to about 80 wt. % of the first polyisobutylene resin; from about 10 to about 30 wt. % of the second polyisobutylene resin; and from about 10 to about 20 wt. % of the multifunctional (meth) acrylate monomer; all relative to the total weight of the adhesive encapsulating composition.

In some embodiments, the adhesive encapsulating composition comprises: a second polyisobutylene resin having a weight average molecular weight of less than about 300,000 g/mol; a multifunctional (meth)acrylate monomer; and a tackifier, wherein the adhesive encapsulating composition is free of a first polyisobutylene having a weight average molecular weight of greater than about 300,000 g/mol. The second isobutylene resin may have a weight average molecular weight of less than about 100,000 g/mol. The adhesive encapsulating composition of this embodiment may comprise: from about 10 to about 50 wt. % of the second polyisobutylene resin; from about 10 to about 40 wt. % of the multifunctional (meth)acrylate monomer; from about 0 to about 60 wt. %, or from about 30 to about 60 wt. %, of the tackifier; all relative to the total weight of the adhesive encapsulating composition.

In some embodiments, the adhesive encapsulating composition comprises: a first polyisobutylene resin having a weight average molecular weight of greater than about 300,000 g/mol, wherein the first polyisobutylene resin comprises 20 wt. % or less of the total weight of the adhesive encapsulating composition; a second polyisobutylene resin having a weight average molecular weight of less than about 300,000 g/mol; a multifunctional (meth)acrylate monomer; and a tackifier. In this embodiment, the first isobutylene resin may have a weight average molecular weight of greater than about 1,000,000 g/mol. The adhesive encapsulating composition may comprise: from about 10 to about 30 wt. % of the second polyisobutylene resin; from about 10 to about 30 wt. % of the multifunctional (meth)acrylate monomer; from about 0 to about 60 wt. %, or from about 40 to about 60 wt. %, of the tackifier; all relative to the total weight of the adhesive encapsulating composition.

The first and second polyisobutylene resins are generally resins having a polyisobutylene resin skeleton in the main or a side chain. In some embodiments, the first and second polyisobutylene resins are substantially homopolymers of isobutylene, for example, polyisobutylene resins available under the tradenames OPPANOL (BASF AG) and GLISSOPAL (BASF AG). In some embodiments, the first and second polyisobutylene resins comprise copolymers of isobutylene, for example, synthetic rubbers wherein isobutylene is copolymerized with another monomer. Synthetic rubbers include butyl rubbers which are copolymers of mostly isobutylene with a small amount of isoprene, for example, butyl rubbers available under the tradenames VISTANEX (Exxon Chemical Co.) and JSR BUTYL (Japan Butyl Co., Ltd.). Synthetic rubbers also include copolymers of mostly isobutylene with n-butene or butadiene. In some embodiments, a mixture of isobutylene homopolymer and butyl rubber may be used, i.e., the first polyisobutylene comprises a homopolymer of isobutylene and the second polyisobutylene comprises butyl rubber, or the first polyisobutylene comprises butyl rubber and the second polyisobutylene comprises a homopolymer of isobutylene. The first and second polyisobutylene resins may each comprise more than one resin.

The polyisobutylene resins generally have a solubility parameter (SP value), which is an index for characterizing the polarity of a compound, that is similar to that of hydrogenated cycloaliphatic hydrocarbon resins, and exhibits good compatibility (i.e., miscibility) with hydrogenated cycloaliphatic hydrocarbon resins, if used, so that a transparent film can be formed. Furthermore, the polyisobutylene resins have low surface energy and therefore can enable spreadability of the adhesive onto an adherent and the generation of voids at the interface is minimized. In addition, the glass transition temperature and the moisture permeability are low and therefore, the polyisobutylene resins are suitable as the base resin of the adhesive encapsulating composition.

The polyisobutylene resins may have desirable viscoelastic properties that, in general, can be used to impart a desired degree of fluidity to the adhesive encapsulating composition. A strain rheometer may be used to determine elastic (storage) modulus, G', and viscous (loss) modulus, G", at various temperatures. G' and G" can then be used to determine the ratio $\tan(\delta)=G''/G'$. In general, the higher the $\tan(\delta)$ value, the more the material is like a viscous material, and the lower the $\tan(\delta)$ value, the more the material is like an elastic solid. In some embodiments, the polyisobutylene resin may be selected such that the adhesive encapsulating composition has a $\tan(\delta)$ value at relatively low frequency of at least about 0.5 when the composition is at temperatures of from about 70° C. to about 110° C. In this way, the composition is able to flow sufficiently over uneven surfaces with little or no air entrapment.

Desirable viscoelastic properties of the adhesive encapsulating composition may be obtained with a first polyisobutylene resin having a weight average molecular weight of greater than about 300,000 g/mole, or greater than 1,000,000, when used in combination with a multifunctional (meth)acrylate monomer without any tackifier. Further, desirable viscoelastic properties of the adhesive encapsulating composition may be obtained with greater than about 50 wt. % of the first polyisobutylene relative to the total weight of the adhesive encapsulating composition.

The multifunctional (meth)acrylate monomer can be saturated or unsaturated and can include aliphatic, alicyclic, aromatic, heterocyclic, and/or epoxy functionality. In some embodiments, saturated long-chain alkyl(meth)acrylates, cycloaliphatic(meth)acrylates, (meth)acrylate/epoxy monomers, or combinations thereof can be utilized as monomers because they can enhance the miscibility of the polyisobutylene resin and optional tackifier. The multifunctional (meth) acrylate monomer can be unsubstituted or substituted with various groups such as hydroxy or alkoxy groups.

Exemplary long chain alkyl(meth)acrylates include, but are not limited to, octyl(meth)acrylate, stearyl(meth)acrylate, 1,9-nonanediol di(meth)acrylate, 1,10-decandiol di(meth) acrylate, and hydrogenated polybutadiene di(meth)acrylate resin. Exemplary cycloaliphatic(meth)acrylates include, but are not limited to, isobornyl(meth)acrylate, tetramethylpiperidiyl methacrylate, pentamethylpiperidiyl methacrylate, dicyclopentanyl(meth)acrylate, dicyclopentenyl(meth)acrylate, tricyclodecanediol di(meth)acrylate, tricyclodecanedimethanol di(meth)acrylate, and (meth)acrylated epoxies.

In some embodiments, multifunctional (meth)acrylate monomers having two, three, four, or even more than four (meth)acrylate groups may be utilized. It will also be understood by one of skill in the art that mixtures of multifunctional (meth)acrylate monomers can be utilized.

The multifunctional (meth)acrylate monomer may be selected so as to optimize adhesion and wettability of the adhesive encapsulating composition for the adherend as described above for the polyisobutylene resin. The multifunctional (meth)acrylate monomer can increase the adhesion and retention strength of the adhesive encapsulating composition because the monomer is cured to form a resin.

As described above, in some embodiments, a tackifier may be used. In general, a tackifier can be any compound or mixture of compounds that increases the tackiness of the adhesive encapsulating composition. Desirably, the tackifier does not increase moisture permeability. The tackifier may comprise a hydrogenated hydrocarbon resin, a partially hydrogenated hydrocarbon resin, a non-hydrogenated hydrocarbon resin, or a combination thereof.

Examples of tackifiers include, but are not limited to, hydrogenated terpene-based resins (for example, resins commercially available under the trade designation CLEARON P, M and K (Yasuhara Chemical)); hydrogenated resins or hydrogenated ester-based resins (for example, resins commercially available under the trade designation FORAL AX (Hercules Inc.); FORAL 105 (Hercules Inc.); PENCEL A (Arakawa Chemical Industries. Co., Ltd.); ESTERGUM H (Arakawa Chemical Industries Co., Ltd.); and SUPER ESTER A (Arakawa Chemical Industries. Co., Ltd.); disproportionate resins or disproportionate ester-based resins (for example, resins commercially available under the trade designation PINECRYSTAL (Arakawa Chemical Industries Co., Ltd.); hydrogenated dicyclopentadiene-based resins which are hydrogenated resins of a C5-type petroleum resin obtained by copolymerizing a C5 fraction such as pentene, isoprene, piperine and 1,3-pentadiene produced through thermal decomposition of petroleum naphtha (for example, resins commercially available under the trade designations ESCOREZ 5300 and 5400 series (Exxon Chemical Co.); EASTOTAC H (Eastman Chemical Co.)); partially hydrogenated aromatic modified dicyclopentadiene-based resins (for example, resins commercially available under the trade designation ESCOREZ 5600 (Exxon Chemical Co.)); resins resulting from hydrogenation of a C9-type petroleum resin obtained by copolymerizing a C9 fraction such as indene, vinyltoluene and α- or β-methylstyrene produced by thermal decomposition of petroleum naphtha (for example, resins commercially available under the trade designation ARCON P or ARCON M (Arakawa Chemical Industries Co., Ltd.)); resins resulting from hydrogenation of a copolymerized petroleum resin of the above-described C5 fraction and C9 fraction (for example, resin commercially available under the trade designation IMARV (Idemitsu Petrochemical Co.)).

Non-hydrogenated hydrocarbon resins include C5, C9, C5/C9 hydrocarbon resins, polyterpene resins, aromatics-modified polyterpene resins or rosin derivatives. If a non-hydrogenated hydrocarbon resin is used, it is typically used in combination with another hydrogenated or partially hydrogenated tackifier. A non-hydrogenated hydrocarbon resin may be used at amounts of less than about 30 wt. %, relative to the total weight of the adhesive encapsulating composition.

In some embodiments, the tackifier comprises a hydrogenated hydrocarbon resin, and particularly, a hydrogenated cycloaliphatic hydrocarbon resin. A specific example of a hydrogenated cycloaliphatic hydrocarbon resin includes ESCOREZ 5340 (Exxon Chemical). In some embodiments, the hydrogenated cycloaliphatic hydrocarbon resin is a hydrogenated dicyclopentadiene-based resin because of its low moisture permeability and transparency. Hydrogenated cycloaliphatic hydrocarbon resins that can be utilized in the adhesive encapsulating compositions typically have a weight average molecular weight from about 200 to 5,000 g/mole. In another embodiment, the weight average molecular weight of the hydrogenated cycloaliphatic hydrocarbon resin is from about 500 to 3,000 g/mole. If the weight average molecular weight exceeds 5,000 g/mole, poor tackification may result or the compatibility with the polyisobutylene resin may decrease.

The tackifier may have a softening temperature or point (ring and ball softening temperature) that may vary, depending at least in part, upon the adhesion of the composition, the temperature utilized, the ease of production, and the like. The ring and ball softening temperature can generally be from about 50 to 200° C. In some embodiments, the ring and ball softening temperature is from about 80 to 150° C. If the ring and ball softening temperature is less than 80° C., the tackifier may undergo separation and liquefaction due to heat generated upon the emission of light by the electronic device. This can cause deterioration of an organic layer such as a light-emitting layer when an organic electroluminescent device is encapsulated directly with an adhesive encapsulating composition. On the other hand, if the ring and ball softening point exceeds 150° C., the amount of tackifier added is so low that satisfactory improvement of relevant characteristics may not be obtained.

In some embodiments, the tackifier comprises a hydrogenated hydrocarbon resin, and particularly, a hydrogenated cycloaliphatic hydrocarbon resin. A specific example of a hydrogenated cycloaliphatic hydrocarbon resin includes ESCOREZ 5340 (Exxon Chemical). In some embodiments, the hydrogenated cycloaliphatic hydrocarbon resin is a hydrogenated dicyclopentadiene-based resin because of its low moisture permeability and transparency. Hydrogenated cycloaliphatic hydrocarbon resins that can be utilized in the adhesive encapsulating compositions typically have a weight average molecular weight from about 200 to 5,000 g/mole. In another embodiment, the weight average molecular weight of the hydrogenated cycloaliphatic hydrocarbon resin is from about 500 to 3,000 g/mole. If the weight average molecular weight exceeds 5,000 g/mole, poor tackification may result or the compatibility with the polyisobutylene resin may decrease.

Thermal initiators and/or photoinitiators may be used in the adhesive encapsulating composition in order to initiate polymerization of the multifunctional (meth)acrylate monomer, if used. Generally, the choice of initiator will depend at least in part on the particular components used in the adhesive encapsulating composition as well as on the desired rate of curing.

Examples of thermal initiators include azo compounds, quinines, nitro compounds, acyl halides, hydrazones, mercapto compounds, pyrylium compounds, imidazoles, chlorotriazines, benzoin, benzoin alkyl ethers, di-ketones, phenones, and organic peroxides such as dilauroyl peroxide and 1,1-di(t-hexylperoxy)-3,3,5-trimethyl cyclohexane available as PERHEXA TMH from NOF Co. The thermal initiator is often used at a concentration of about 0.01 to about 10 weight percent or about 0.01 to about 5 weight percent based on the total weight of the adhesive encapsulating composition. Mixtures of thermal initiators may be used.

Examples of photoinitiators include acetophenones, benzoins, benzophenones, benzoyl compounds, anthraquinones, thioxanthones, phospine oxides such as phenyl- and diphenyl phosphine oxides, ketones, and acridines. Examples of photoinitiators also include those available under the tradenames DAROCUR (Ciba Specialty Chemicals), IRGACURE (Ciba Specialty Chemicals), and LUCIRIN (BASF) such as ethyl 2,4,6-trimethylbenzoyldiphenyl phosphinate which is available as LUCIRIN TPO. The photoinitiator may also comprise a cationic photoinitiator available under the names UVI (Union Carbide Corp.), SP (Adeka Corp.), SI (Sanshin Chemical Co.), KI (Degussa AG), PHOTOINITIATOR (Rodia Inc.), CI (Nippon Soda Co., Ltd.), and ESACURE (Lamberdi SpA Chemical Specitalies). The photoinitiator is often used at a concentration of about 0.01 to about 10 weight percent or about 0.01 to about 5 weight percent based on the total weight of the adhesive encapsulating composition. Mixtures of photoinitiators may be used.

If a thermal initiator is used, the organic electroluminescent device may be made by: providing a pair of opposing electrodes; providing a light-emitting unit having at least an organic light-emitting layer, the light-emitting unit disposed between the pair of opposing electrodes; providing an adhesive encapsulating composition disposed on, above, or around the light-emitting unit, the adhesive encapsulating composition comprising any of those disclosed herein and a thermal initiator; and heating the adhesive encapsulating composition to form a polymerized adhesive encapsulating composition. In some embodiments, heating the adhesive encapsulating composition comprises heating the composition to a temperature of less than about 110° C.

If a photoinitiator is used, the organic electroluminescent device may be made by: providing a pair of opposing electrodes; providing a light-emitting unit having at least an organic light-emitting layer, the light-emitting unit disposed between the pair of opposing electrodes; providing an adhesive encapsulating composition disposed on, above, or around the light-emitting unit, the adhesive encapsulating composition comprising any of those disclosed herein and a UV initiator; and applying UV radiation to the adhesive encapsulating composition to form a polymerized adhesive encapsulating composition.

In one embodiment, onium salts, can be utilized because of their low level of metal ion contamination. Onium salts include, but are not limited to, iodonium, sulfonium and phosphonium complex salts. Generally useful onium salts can be of the general formula $Y^+X^-$. Y can include aryldialkylsulfonium, alkyldiarylsulfonium, triarylsulfonium, diaryliodonium and tetraaryl phosphonium cations, where each alkyl and aryl group can be substituted. X can include $PF_6^-$, $SbF_6^-$, $CF_3SO_3^-$, $(CF_3SO_2)_2N^-$, $(CF_3SO_2)_3C^-$, $(C_6F_5)_4B^-$ anions.

In addition to the above-described components, the adhesive encapsulating composition may also contain optional additives. For example, the adhesive encapsulating composition may contain a softening agent. The softening agent can be useful, for example, to adjust the composition viscosity to improve the processability (for example, making the composition suitable for extrusion), to enhance the initial adhesion at low temperatures due to a reduction in the glass transition temperature of the composition, or to provide an acceptable balance between the cohesion and adhesion. In one embodiment, the softening agent is selected to have low volatility, to be transparent, and to be free of coloration and/or odor.

Examples of softening agents that can be utilized include, but are not limited to, a petroleum-based hydrocarbon such as an aromatic type, paraffin type and naphthene type; a liquid rubber or a derivative thereof, such as liquid polyisobutylene resin, liquid polybutene and hydrogenated liquid polyisoprene; petrolatum; and petroleum-based asphalts. In embodiments where softening agents are utilized, one softening agent or a combination of softening agents may be used.

Specific examples of softening agents include, but are not limited to, those commercially available under the trade names NAPVIS (BP Chemicals), CALSOL 5120 (naphthene-based oil, Calumet Lubricants Co.), KAYDOL (paraffin-based, white mineral oil, Witco Co.), TETRAX (Nippon Oil Co.), PARAPOL 1300 (Exxon Chemical Co.), and INDOPOL H-300 (BPO Amoco Co.). Other specific examples of softening agents include other polyisobutylene resin homopolymers, polybutylene such as material commercially available from Idemitsu Kosan Co., Ltd., polybutene such as material commercially available from Nihon Yushi Co., Ltd., and other liquid polybutene polymers. Still other specific examples of softening agents include those commercially available under the trade names ESCOREZ 2520 (liquid aromatic petroleum hydrocarbon resin, Exxon Chemical Co.), REGALREZ 1018 (liquid hydrogenated aromatic hydrocarbon resin, Hercules Inc.), and SYLVATAC 5N (liquid resin of modified rosin ester, Arizona Chemical Co.).

In one embodiment, the softening agent is a saturated hydrocarbon compound. In another embodiment, the softening agent is liquid polyisobutylene resin or liquid polybutene. Polyisobutylene resin and polybutene having a carbon-carbon double bond at the terminal and a modified polyisobutylene resin can be utilized. A modified polyisobutylene resin has a double bond that has been modified by hydrogenation, maleination, epoxidation, amination, or similar methods.

Because of the direct encapsulation of an organic electroluminescent device with the adhesive encapsulating composition, a softening agent having a relatively high viscosity can be utilized to prevent the softening agent from separating from the adhesive encapsulating composition and permeating into the interface between the electrode and the light-emitting unit. For example, a softening agent having a kinematic viscosity of 500 to 5,000,000 $mm^2/s$ at 100° C. can be used. In another embodiment, a softening agent having a kinematic viscosity of 10,000 to 1,000,000 $mm^2/s$ can be used. The softening agent may have various molecular weights, but because of the direct encapsulation of an organic electroluminescent device with the adhesive encapsulating composition, the softening agent can have a weight average molecular weight of from about 1,000 to 500,000 g/mole. In even another embodiment, the weight average molecular weight can be from about 3,000 to 100,000 g/mole to prevent the softening agent from separating from the adhesive encapsulating composition and dissolving the organic materials such as layers of the organic light-emitting unit.

The amount of the softening agent used is not generally limited but in light of the desired adhesive force, heat resistance, and rigidity of the adhesive encapsulating composition, the softening agent typically can be used in an amount of about 50 wt. % or less based on the entire adhesive encapsulating composition. In another embodiment, the adhesive encapsulating composition contains from about 5 to 40 wt. % softening agent. If the amount of softening agent used exceeds 50 wt. %, excessive plasticization may result, which can impact the heat resistance and rigidity.

Fillers, coupling agents, ultraviolet absorbents, ultraviolet stabilizers, antioxidants, stabilizers, or some combination thereof may also be added to the adhesive encapsulating composition. The amount(s) of additive is typically chosen so that the it does not have an adverse effect on the curing rate of the multifunctional (meth)acrylate monomer, or it does not have an adverse effect on the adhesive physical properties of the adhesive encapsulating composition.

Examples of fillers that can be utilized include, but are not limited to, a carbonate of calcium or magnesium (for example, calcium carbonate, magnesium carbonate, and dolomite); silicate (for example, kaolin, calcined clay, pyrophyllite, bentonite, sericite, zeolite, talc, attapulgite, and wollastonite); a silicic acid (for example, diatomaceous earth, and silica); an aluminum hydroxide; palaite; a barium sulfate (for example, precipitated barium sulfate); a calcium sulfate (for example, gypsum); a calcium sulfite; a carbon black; a zinc oxide; a titanium dioxide; a dessicant (for example, calcium oxide and barium oxide); and mixtures thereof.

The filler may have different particle diameters. For example, if it is desired to provide an adhesive encapsulating composition having a high transmission in the visible range, an average primary particle diameter of the filler can be in the range of 1 to 100 nm. In another embodiment, the filler can have an average primary particle diameter in the range of 5 to 50 nm. Further, when fillers in the form of plates or squamations are used to improve the low moisture permeability, their average primary particle diameter can be in the range of 0.1 to 5 μm. Moreover, in view of the dispersability of the filler in the adhesive encapsulating composition, hydrophobic surface treated hydrophilic fillers can be used. Any conventional hydrophilic filler can be modified by a hydrophobic treatment. For example, the surface of the hydrophilic filler could be treated with an alkyl, aryl or aralkyl silane coupling agent containing hydrophobic groups such as n-octyltrialkoxy silane, a silylation agent such as dimethyldichlorosilane and hexamethyldisilazane, polydimethylsiloxanes having hydroxyl terminals, higher alcohols such as stearyl alcohol, or higher aliphatic acids such as stearic acid.

Examples of silica fillers include, but are not limited to, products treated with dimethyldichlorosilane such as those commercially available under the trade designation AEROSIL-R972, R974 or R976 (Nippon Aerosil Co., Ltd.); products treated with hexamethyldisilazane such as those commercially available under the trade designation AEROSIL-RX50, NAX50, NX90, RX200 or RX300 (Nippon Aerosil Co., Ltd.); products treated with octylsilane such as those commercially available under the trade designation AEROSIL-R805 (Nippon Aerosil Co., Ltd.); products treated with dimethylsilicone oil such as those commercially available under the trade designation AEROSIL-RY50, NY50, RY200S, R202, RY200 or RY300 (Nippon Aerosil Co., Ltd.); and products commercially available under the trade designation CAB ASIL TS-720 (Cabot Co., Ltd.).

The fillers may be used alone, or in combination. In embodiments that include fillers, the amount of fillers added is generally from 0.01 to 20 wt. % based on the total amount of the adhesive encapsulating composition.

Couplings agents that are not used as surface modifiers of particles may be added to improve adhesion of the encapsulating composition. Coupling agents typically have portions that react or interact with organic components and portions that react or interact with inorganic components. When added to an adhesive encapsulating composition, a coupling agent my react or interact with polymers and an inorganic surface such as any conductive metal, e.g., ITO, disposed on the substrate. This can improve adhesive between the polymer and the substrate. Examples of useful coupling agents include methacryloxypropyl methyl dimethoxy silane (KBM502 from Shinestsu Chemical Co., Ltd.), 3-mercaptopropyl methyl dimethoxy silane (KBM802 from Shinestsu Chemical Co., Ltd.), and glycidyl propyl trimethoxysilane (KBM403 from Shinestsu Chemical Co., Ltd.).

Examples of ultraviolet absorbents include, but are not limited to, benzotriazole-based compounds, oxazolic acid amide-based compounds, and benzophenone-based compounds. The ultraviolet absorbents, when used, can be used in an amount from about 0.01 to 3 wt. % based on the total amount of the adhesive encapsulating composition.

Examples of antioxidants that can be used include, but are not limited to, hindered phenol-based compounds and phosphoric acid ester-based compounds. Such compounds, when used, can be used in an amount from about 0.01 to 2 wt. % based on the total amount of the adhesive encapsulating composition.

Examples of stabilizers that can be used include, but are not limited to, phenol-based stabilizers, hindered amine-based stabilizers, imidazole-based stabilizers, dithiocarbamate-based stabilizers, phosphorus-based stabilizers, sulfur ester-based stabilizers, and phenothiazine. Such compounds, when utilized, can be used in an amount from about 0.001 to 3 wt. % based on the total amount of the adhesive encapsulating composition.

The adhesive encapsulating composition may be prepared by various methods known to those of skill in the art. For example, the adhesive encapsulating composition can be prepared by thoroughly mixing the above-described components. For mixing the composition, an arbitrary mixer such as a kneader or an extruder may be used. The resulting composition can be used as the adhesive encapsulating composition or can be combined with other components to form the adhesive encapsulating composition.

The adhesive encapsulating composition can be used in a variety of forms. For example, the adhesive encapsulating composition can be applied directly to a device or any of its components or the like by using a screen printing method or similar methods. The adhesive encapsulating composition may also be coated on an appropriate substrate to form an adhesive encapsulating film. FIG. 1A shows a cross-sectional structure of an exemplary adhesive encapsulating film 100A comprising a substrate 110 and adhesive encapsulating layer 120. The substrate may be temporarily used for shaping or may be integrated until use of the adhesive encapsulating composition. In either case, the surface of the substrate can be release-treated, for example, with a silicone resin. Coating of the adhesive encapsulating composition can be carried out using methods known to those of skill in the art, for example, die coating, spin coating, doctor blade coating, calendaring, extrusion, and the like.

The support used in the adhesive encapsulating film may comprise a backing, the backing comprising a film or a sheet of, for example, paper, plastic, and/or metal foil. Similar to the surface of the substrate described above, the backing can be a release liner such that it is treated with a release agent, for example, a silicone resin.

The adhesive encapsulating layer may have various thicknesses, for example, from about 5 to 200 μm, from about 10 to 100 μm, or from about 25 to 100 μm. The adhesive film may be used as an encapsulant by separating it from the backing In one embodiment, the outer surface of the adhesive encapsulating layer can be protected with means such as a release liner.

Other than the structure shown in FIG. 1A, the adhesive encapsulating film can be provided in various forms. For example, in the case where the adhesive encapsulating composition is used as an encapsulant for an electronic device, the adhesive encapsulating film may be used by combining it with a constituent element of the electronic device.

Figure 1B:
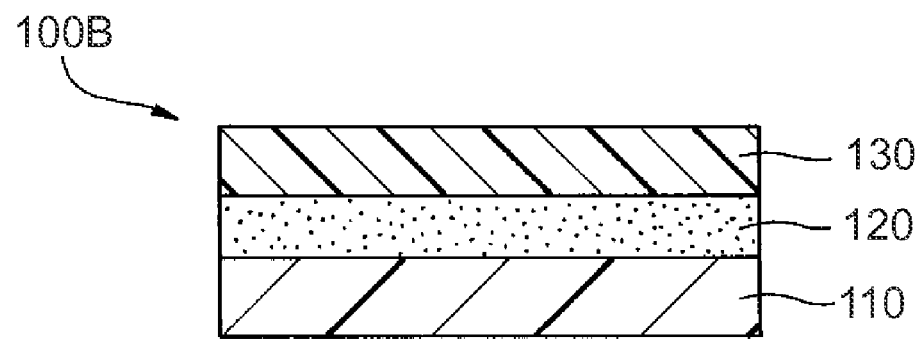

For example, the adhesive encapsulating film may further comprise a gas-barrier film 130 disposed on the adhesive encapsulating layer 120 opposite the substrate 110 as shown in FIG. 1B. The gas-barrier film 130 is a film having barrier properties to water vapor, oxygen, or both. Any suitable materials and construction can be used for the gas-barrier film 130. The gas-barrier layer may comprise an inorganic material such as SiO, SiN, DLF (Diamond-like Film), or DLG (Diamond-like Glass). The gas-barrier layer may also comprise a polymer film selected from the group consisting of: polyesters, polyethersulfones, polyimides, fluorocarbons, and multilayer films comprising alternating polymer and inorganic layers. The multilayer films comprising alternating polymer and inorganic layers are generally disposed on a flexible visible light transmissive substrate; these multilayer films are described in U.S. Pat. No. 7,018,713 B2 (Padiyath et al.).

Figure 1C:
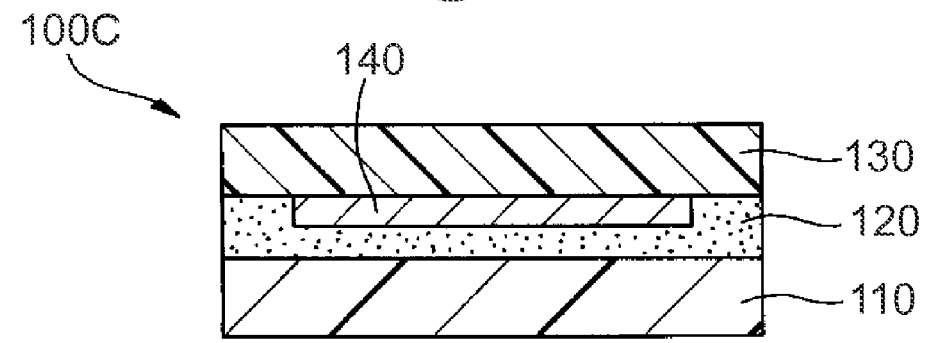
Figure 1D:
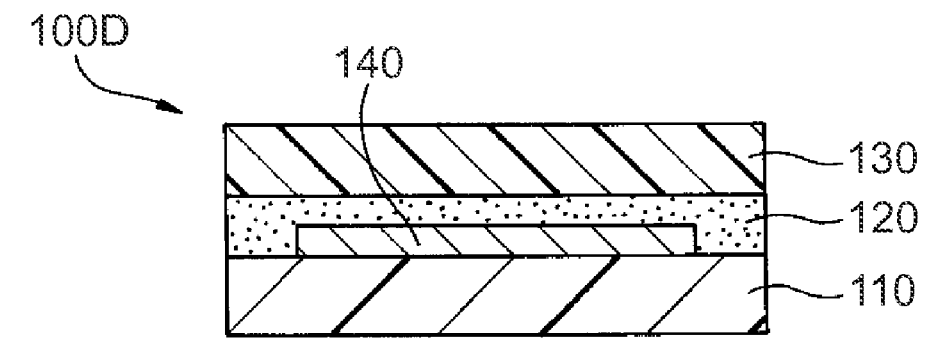

Also, the adhesive encapsulating film may further comprise a trapping agent 140 as shown in FIGS. 1C and 1D. In FIG. 1C, the trapping agent is disposed between gas-barrier film 130 and adhesive encapsulating composition 120. In FIG. 1D, the trapping agent is disposed between the adhesive encapsulating composition and substrate 110. The trapping agent may comprise a material that functions as a water absorbent or desiccant. Any suitable materials and construction can be used for the trapping layer. The trapping layer may comprise an inorganic material such as a metal or metal oxide, e.g., Ca, Ba, CaO or BaO. In some embodiments, the shape is generally a film-like or sheet-like form. Also, as shown in FIG. 1D, the area and shape of each layer can be adjusted such that at least a part of the adhesive encapsulating layer directly adheres to the substrate.

The adhesive encapsulating film may comprise both a gas-barrier film and a trapping agent. In this way, encapsulation of an electronic device can be enhanced and, at the same time, the encapsulation process can be simplified.

The adhesive encapsulated film may be made by a variety of methods that include, but are not limited to, screen printing methods, spin coating methods, doctor blade methods, calendar methods, extrusion-forming methods using a rotary die, T-die, or the like.

In some methods, a lamination method is used that includes forming the adhesive encapsulating film on a backing 110, serving as a release film, and then transferring the adhesive film to a component of the electroluminescent device. These methods may also be used to form the gas-barrier film and the trapping agent.

An organic electroluminescent device is also disclosed herein. The organic electroluminescent device may comprise: a pair of opposing electrodes; a light-emitting unit having at least an organic light-emitting layer, the light-emitting unit disposed between the pair of opposing electrodes; and an adhesive encapsulating composition disposed on, above, or around the light-emitting unit, the adhesive encapsulating composition comprising any one of the adhesive encapsulating compositions described herein.

In an organic electroluminescent device, the electrodes and light-emitting unit may be referred to as a stacked body. The stacked body can have various constitutions, for example, the stacked body may comprise one light-emitting unit is incorporated or a combination of two or more light-emitting units. The constitution of the stacked body is described below.

Figure 2:
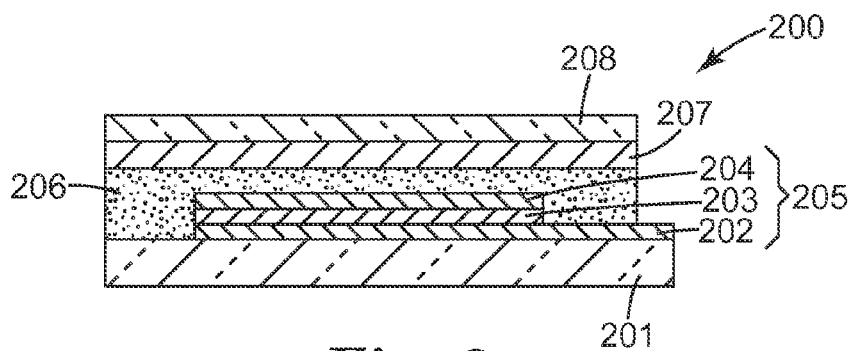
FIG. 2 shows a schematic cross section of an organic light emitting diode.

In some embodiments, the stacked body is supported on a device substrate. FIG. 2 shows exemplary organic electroluminescent device 200 comprising stacked body 205 disposed on substrate 201. The stacked body is encapsulated with adhesive encapsulating layer 206 and optional components 207 and 208. The stacked body 205 comprises anode 202, light-emitting unit 203, and cathode 204.

The device substrate may be rigid or hard (not easily bended) or it may be flexible. Hard substrates may comprise an inorganic material such as yttria-stabilized zirconia (YSZ), glass, and metal, or the hard substrate may comprise a resin material such as polyesters, polyimides, and polycarbonates. Flexible substrates may comprise a resin material, for example, a fluorine-containing polymer (for example, polyethylene trifluoride, polychlorotrifluoroethylene (PCTFE), a copolymer of vinylidene fluoride (VDF) and chlorotrifluoroethylene CTFE), a polyimide, a polycarbonate, a polyethylene terephthalate, a polyethylene naphthalate, an alicyclic polyolefin, or an ethylene-vinyl alcohol copolymer.

The device substrate is not limited in its shape, structure, dimension or the like. The device substrate often has a plate shape. The device substrate may be transparent, colorless, translucent, or opaque. The substrate can be coated with a gas-barrier layer containing an inorganic material such as SiO, SiN, DLF (Diamond-like Film), or DLG (Diamond-like Glass). The gas-barrier layer film may also comprise a flexible visible light transmissive substrate having alternating polymer and inorganic layers disposed thereon; these films are described in U.S. Pat. No. 7,018,713 B2 (Padiyath et al.). The gas-barrier layer can be formed using a method such as vacuum vapor deposition, physical vapor deposition, and plasma CVD (Chemical Vapor Deposition).

Optional component 207 may comprise a color filter layer. Optional component 208 may comprise a flexible or rigid or material. For example, optional component 208 may comprise a sealing cap (sometimes called a sealing plate or the like) comprising a hard material, typically, glass or a metal. The optional component 207 may also comprise a gas-barrier layer.

The stacked body 205 comprises a pair of opposing electrodes 202 and 204 (i.e., an anode and a cathode), and a light-emitting unit 203 disposed between the electrodes. The light-emitting unit may have various layered structures containing an organic light-emitting layer, which is described below.

The anode generally functions to supply a hole to the organic light-emitting layer. Any known anode material can be used. The anode material generally has a work function of 4.0 eV or more, and suitable examples of the anode material include, but are not limited to, a semiconducting metal oxide such as tin oxide, zinc oxide, indium oxide and indium tin oxide (ITO); a metal such as gold, silver, chromium and nickel; and an organic electrically conducting material such as polyaniline and polythiophene. The anode usually includes a film formed, for example, by vacuum vapor deposition, sputtering, ion plating, CVD or plasma CVD. In some applications, the anode can be subjected to patterning by etching or the like. The thickness of the anode can be varied over a wide range and can generally be from about 10 nm to 50 µm.

The cathode used in conjunction with the anode generally functions to inject an electron into the organic light-emitting layer. Any known cathode materials can be used. The cathode material generally has a work function of 4.5 eV or less, and suitable examples of the cathode material include, but are not limited to, alkali metals such as Li, Na, K and Cs; composite materials such as LiF/Al, alkaline earth metals such as Mg and Ca; rare earth metals such as gold, silver, indium and ytterbium; and alloys such as MgAg. The cathode usually includes a film formed, for example, by vacuum vapor deposition, sputtering, ion plating, CVD or plasma CVD. In some applications, the cathode can be subjected to patterning by etching or the like. The thickness of the cathode may be varied over a wide range but can be from about 10 nm to 50 µm.

The light-emitting unit positioned between the anode and the cathode may have various layer structures. For example, the light-emitting unit may have a single layer structure comprising only an organic light-emitting layer or may have a multilayer structure such as organic light-emitting layer/electron transport layer, hole transport layer/organic light-emitting layer, hole transport layer/organic light-emitting layer, hole transport layer/organic light-emitting layer/electron transport layer, organic light-emitting layer/electron transport layer/electron injection layer, and hole injection layer/hole transport layer/organic light-emitting layer/electron transport layer/electron injection layer. Each of these layers is described below.

The organic light-emitting layer can comprise at least one light-emitting material and may optionally contain a hole transport material, an electron transport material, or the like. The light-emitting material is not particularly limited and any light-emitting material commonly used in the production of an organic electroluminescent device may be utilized. The light-emitting material can include a metal complex, a low molecular weight fluorescent coloring material, a fluorescent polymer compound, or a phosphorescent material. Suitable examples of the metal complex include, but are not limited to, tris(8-quinolinolate)aluminum complex (Alq3), bis(benzoquinolinolate)beryllium complex (BeBq2), bis(8-quinolinolate)zinc complex (Znq2), and phenanthroline-based europium complex (Eu(TTA)3(phen)). Suitable examples of the low molecular weight fluorescent coloring material include, but are not limited to, perylene, quinacridone, coumarin and 2-thiophenecarboxylic acid (DCJTB). Suitable examples of the fluorescent polymer compound include, but are not limited to, poly(p-phenylenevinylene) (PPV), 9-chloromethylanthracene (MEH-PPV), and polyfluorene (PF). Suitable examples of phosphorescent materials include platinum octaethyl porphryin and cyclometallated iridium compounds.

The organic light-emitting layer can be formed from light-emitting materials such as those discussed above using any suitable method. For example, the organic light-emitting layer can be formed using a film-forming method such as vacuum vapor deposition or physical vapor deposition. The thickness of the organic light-emitting layer is not particularly limited but can generally be from about 5 nm to 100 nm.

The organic light-emitting unit may include a hole transport material. The hole transport material generally functions to inject a hole from the anode, transport a hole, or block an electron injected from the cathode. Suitable examples of hole transport materials include, but are not limited to, N,N'-diphenyl-N,N'-di(m-tolyl)benzidine (TPD), N,N,N',N'-tetrakis(m-tolyl)-1,3-phenylenediamine (PDA), 1,1-bis[4-[N,N-di(p-tolyl)amino]phenyl]cyclohexane (TPAC), and 4,4',4''-tris[N,N',N''-triphenyl-N,N',N''-tri(m-tolyl)]amino]-phenylene (m-MTDATA). The hole transport layer and the hole injection layer each may be formed by using a film-forming method such as vacuum vapor deposition and physical vapor deposition. The thickness of these layers is not particularly limited but can generally be from about 5 nm to 100 nm.

The organic light-emitting unit can include an electron transport material. The electron transport material can function to transport an electron, or block a hole injected from the anode. Suitable examples of electron transport material include, but are not limited to, 2-(4-tert-butylphenyl)-5-(4-biphenylyl)-1,3,4-oxadiazole (PBD); and 3-(4-tert.-butylphenyl)-4-phenyl-5-(4-biphenylyl)-1,2,4-triazole (TAZ) AlQ. The electron transport layer and the electron injection layer each may be formed using a film-forming method such as vacuum vapor deposition and physical vapor deposition. The thickness of these layers is not particularly limited but can generally be from about 5 nm to 100 nm.

In the organic electroluminescent device disclosed herein, the above-described stacked body may be encapsulated with the adhesive encapsulating composition or the adhesive encapsulating film. In either case, they may be used in the form of a layer entirely covering the exposed surface of the stacked body disposed on the device substrate.

In the organic electroluminescent device, the adhesive encapsulating composition or the adhesive aencapsulating film has adhesive properties by itself. For example, laminating the film does not require an additional adhesive layer. That is, additional laminating adhesives can be omitted and the simplification and reliability of the production process can be enhanced. Furthermore, unlike conventional techniques, an encapsulation space does not remain in the device because the stacked body is covered with adhesive encapsulating composition. Without the encapsulation space, moisture permeation is reduced, thereby preventing degradation of the device characteristics while maintaining compact and thin devices. If an encapsulation space is desired, a gasket of adhesive surrounding the device may be used.

Further, an adhesive encapsulating composition or an encapsulating film can be transparent in the visible region (380 to 800 nm) of the spectrum. Because the encapsulating film typically has an average transmittance of not less than 80% or not less than 90%, the encapsulating film does not substantially deteriorate the light-emission efficiency of the organic electroluminescent device. This may be particularly useful for top emitting OLEDs.

On the outside of the stacked body, a passivation film can be disposed to protect the top and bottom of the stacked body. The passivation film can be formed of an inorganic material such as SiO, SiN, DLG, or DLF by using a film-forming method such as, for example, vacuum vapor deposition and sputtering. The thickness of the passivation film is not particularly limited but can generally be about 5 nm to 100 nm.

On the outside of the stacked body, a material capable of absorbing moisture and/or oxygen or a layer thereof can also be disposed. Such a layer can be disposed at any position as long as the desired effect is provided. Such a material or layer is sometimes called a desiccant, moisture absorbent, desiccant layer or the like but is referred to herein as a "trapping agent" or a "trapping layer". Examples of the trapping agents include, but are not limited to, metal oxides such as calcium oxide, magnesium oxide, and barium oxide; sulfates such as magnesium sulfate, sodium sulfate, and nickel sulfate; an organic metal compound such as aluminum oxide octylate; and $B_2O_3$ from US 2006/0063015 (McCormick et al.). Polysiloxanes as described in Japanese Patent Application No. 2005-057523 may also be used. The trapping layer may be formed by any method known to those of skill in the art based on the kind of trapping agent. For example, the trapping layer can be formed by attaching a film having a trapping agent dispersed therein by using a pressure sensitive adhesive, spin-coating a trapping agent solution, or a film-forming method such as vacuum vapor deposition and sputtering. The thickness of the trapping layer is not limited but can generally be from about 5 nm to 500 µm.

In addition to the above-described constituent elements, an organic electroluminescent device may additionally comprise various constituent elements known to those of skill in the art.

If a full color device is desired, an organic electroluminescent device employing a white light-emitting portion can be used in combination with a color filter. Such combination would not be necessary in a three-color light emitting method. Also, in the case of an organic electroluminescent device employing a color conversion method (CCM), a color filter for correction of color purity can be used in combination.

According to an alternate method, the organic electroluminescent device may have a protective film as the outermost layer. This protective film can include a protective film having a water vapor-barrier or oxygen-barrier property and is sometimes called a "gas-barrier film" or a "gas-barrier film layer". The gas-barrier film layer may be formed of various materials having water vapor-barrier properties. Suitable materials include, but are not limited to, a polymer layer including a fluorine-containing polymer (e.g., polyethylene naphthalate, polyethylene trifluoride, polychlorotrifluoroethylene (PCTFE), polyimide, polycarbonate, polyethylene terephthalate, alicyclic polyolefin and an ethylene-vinyl alcohol copolymer; a stacked body of such polymer layers or a layer obtained by coating such a polymer layer with an inorganic thin film (e.g., silicon oxide, silicon nitride, aluminum oxide, DLG, or DLF) by using a film-forming method (e.g., sputtering), may be used. The gas-barrier layer film may also comprise a flexible visible light transmissive substrate having alternating polymer and inorganic layers disposed thereon; these films are described in U.S. Pat. No. 7,018,713 B2 (Padiyath et al.). The thickness of the gas-barrier film layer may be varied over a wide range but can generally be from about 10 nm to 500 µm.

The organic electroluminescent device disclosed herein can be utilized as an illumination or a display means in various fields. Examples of applications include illumination devices used in place of a fluorescent lamp; display devices of a computer device, television receiver, DVD (digital video disc), audio instrument, measurement hardware, cellular phone, PDA (personal digital assistance), panel or the like; backlight; and light source array of a printer or the like.

The adhesive encapsulating compositions may also by used to encapsulate metal and metal oxide components disposed on a substrate. For example, the adhesive encapsulating compositions may be used for touch screens in which a substantially transparent conductive metal such as indium tin oxide (ITO) is deposited on a substrate such as glass, or on a polymeric film such as cellulose triacetate. The adhesive encapsulating compositions may be low or free of acidic components which may cause corrosion to metals and/or substrates.

Also disclosed herein is a photovoltaic cell module comprising: a photovoltaic cell or an array of photovoltaic cells (a series of interconnected photovoltaic cells), and an adhesive encapsulating composition disposed on, above, or around the photovoltaic cell, the adhesive encapsulating composition comprising any of the above-described compositions for use with organic electroluminescent devices.

In general, photovoltaic cells are semiconductor devices used to convert light into electricity and may be referred to as solar cells. Upon exposure to light, a photovoltaic cell generates a voltage across its terminals resulting in a consequent flow of electrons, the size of which is proportional to the intensity of the light impinging on the photovoltaic junction formed at the surface of the cell. Typically, a series of solar cell modules are interconnected to form a solar array which functions as a single electricity producing unit wherein the cells and modules are interconnected in such a way as to generate a suitable voltage in order to power a piece of equipment or supply a battery for storage, etc.

Semiconductor materials used in photovoltaic cells include crystalline or polycrystalline silicon or thin film silicon, e.g., amorphous, semicrystalline silicon, gallium arsenide, copper indium diselenide, organic semiconductors, CIGS, and the like. There are two types of photovoltaic cells, wafers and thin films. A wafer is a thin sheet of semiconductor material made by mechanically sawing it from a single crystal or multicrystal ingot or casting. Thin film based photovoltaic cells are continuous layers of semiconducting materials typically deposited on a substrate or supersubstrate using sputtering or chemical vapour deposition processes or the like.

Wafer and thin film photovoltaic cells are often fragile enough such that a module may require one or more supports. The support may be rigid, e.g., a glass plate rigid material, or it may be a flexible material, e.g., a metallic film and/or sheet of suitable polymer material such as a polyimide or polyethylene terephthalate. The support may be a top layer or superstrate, i.e., positioned between the photovoltaic cell and the light source, and which is transparent to light coming from the light source. Alternatively or in addition thereto, the support may be a bottom layer which is positioned behind the photovoltaic cell.

The adhesive encapsulating composition may be disposed on, above, or around the photovoltaic cell. The adhesive encapsulating composition may be used to protect the photovoltaic cell from the environment, and/or it may be used to adhere the cell to the support(s). The adhesive encapsulating composition may be applied as one of several encapsulating layers which may either have the same compositions or different compositions. Further, the adhesive encapsulating composition may be applied directly on the cell and then cured, or an adhesive encapsulating film may be used wherein the adhesive encapsulant layer is laminated to the photovoltaic cell and substrate and then the layer is cured.

Figure 3A:
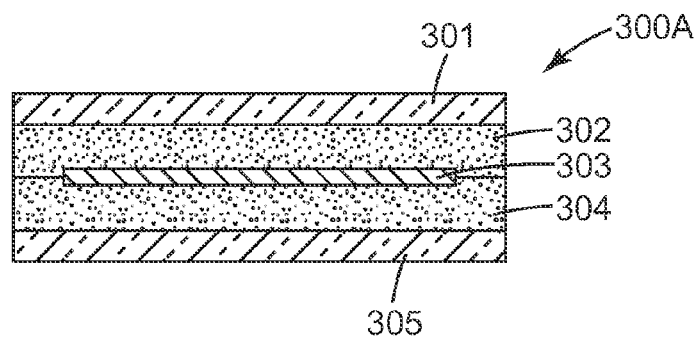
FIGS. 3A-3C show schematic cross sections of exemplary photovoltaic cells.
Figure 3B:
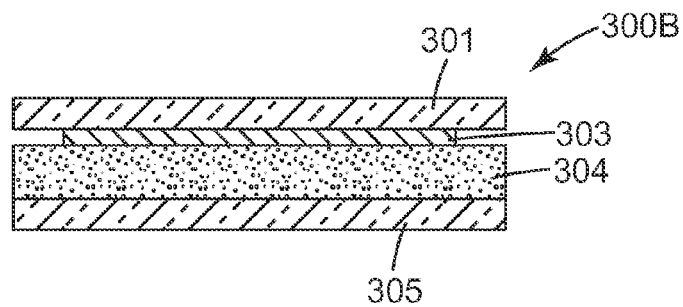
Figure 3C:
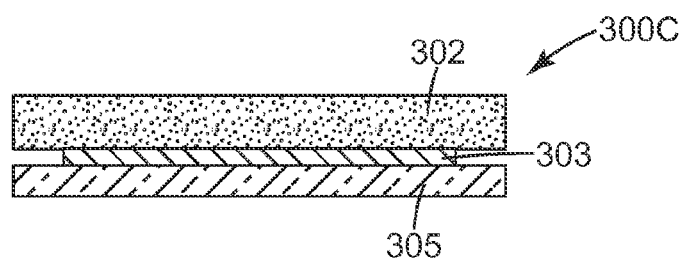

FIG. 3A shows a cross-sectional structure of an exemplary photovoltaic cell 300A comprising adhesive encapsulating layers 302 and 304 which encapsulate photovoltaic cell 303. Front substrate 301 and back substrate 305 are also shown. FIG. 3B shows a cross-sectional structure of an exemplary photovoltaic cell 300B wherein photovoltaic cell 303 is deposited on front substrate 301 by a suitable method such as chemical vapor deposition after which adhesive encapsulating layer 304 is applied, (or the adhesive is preapplied to 305), for example, using an adhesive encapsulating film with a removable substrate. FIG. 3B shows a cross-sectional structure of another exemplary photovoltaic cell 300C wherein photovoltaic cell 303 is deposited on back substrate 305 by a suitable method such as chemical vapor deposition after which adhesive encapsulating layer 302 is applied, for example, using an adhesive encapsulating film with a removable substrate. A front substrate may be utilized if required.

Also disclosed herein is a thin film transistor comprising a semiconductor layer and an adhesive encapsulating composition disposed on, above, or around the semiconductor layer, the adhesive encapsulating composition comprising any one of the adhesive encapsulating compositions described herein. A thin film transistor is a special kind of field effect transistor made by depositing thin films of semiconductor material, as well as a dielectric layer and metallic contacts over a substrate. The thin film transistor may be used to drive a light-emitting device.

Useful semiconductor materials include those described above for photovoltaic cells as well as organic semiconductors. Organic semiconductors include aromatic or otherwise conjugated electron systems including small molecules such as rubrene, tetracene, pentacene, perylenediimides, tetracyanoquinodimethane, and polymers such as polythiophenes including poly(3-hexylthiophene), polyfluorene, polydiacetylene, poly(2,5-thienylene vinylene), poly(p-phenylene vinylene) and the like. Deposition of inorganic materials may be carried out using chemical vapor deposition methods or physical vapor deposition. Deposition of organic materials may be carried out by either vacuum evaporation of small molecules, or by solution-casting of polymers or small molecules.

Thin film transistors generally include a gate electrode, a gate dielectric on the gate electrode, a source electrode, a drain electrode adjacent to the gate dielectric, and a semiconductor layer adjacent to the gate dielectric and adjacent to the source and drain electrodes; see, for example, S. M. Sze, Physics of Semiconductor Devices, $2^{nd}$ edition, John Wiley and Sons, page 492, New York (1981). These components can be assembled in a variety of configurations.

Figure 4A:
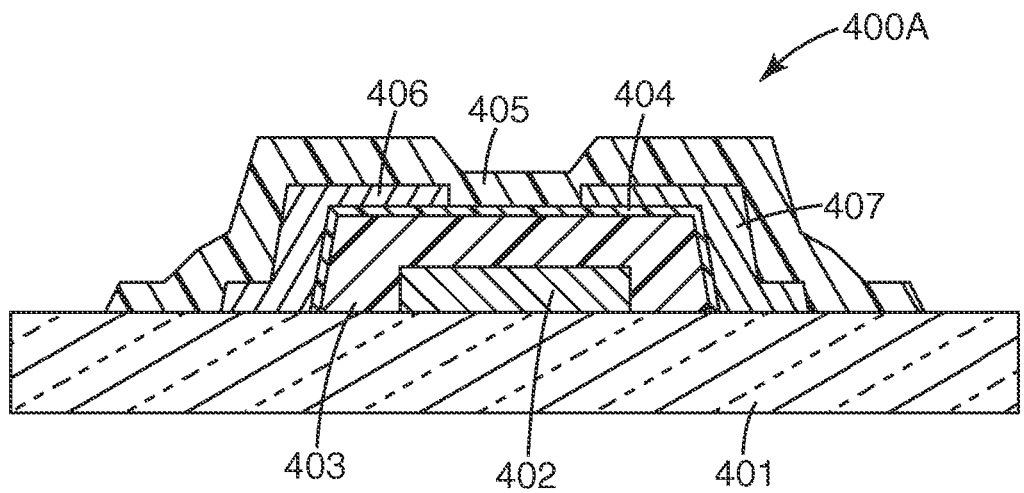
FIGS. 4A and 4B show schematic cross sections of exemplary thin film transistors.

FIG. 4A shows a cross-sectional structure of an exemplary thin film transistor 400A disclosed in U.S. Pat. No. 7,279,777 B2 (Bai et al.) comprising substrate 401, gate electrode 402 disposed on the substrate, dielectric material 403 disposed on the gate electrode, optional surface-modifying film 404 disposed on the gate electrode, semiconductor layer 405 adjacent to the surface-modifying film, and source electrode 406 and drain electrode 407 contiguous to the semiconductor layer.

Figure 4B:
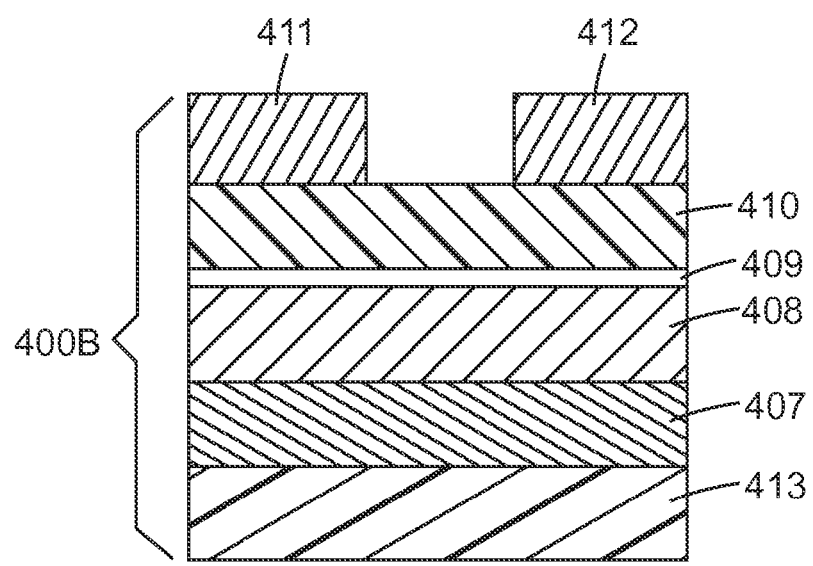

FIG. 4B shows a cross-sectional structure of another exemplary thin film transistor 400B disclosed in U.S. Pat. No. 7,352,038 B2 (Kelley et al.) comprising gate electrode 407 disposed on substrate 413. Gate dielectric 408 is disposed on the gate electrode. A substantially non-fluorinated polymer layer 409 is interposed between the gate dielectric and organic semiconductor layer 410. Source 411 and drain 412 electrodes are provided on the semiconductor layer.

The invention is described further by the following examples, however, the examples are not intended to limit the invention in any way.

EXAMPLES

Test Methods
Water Vapour Transmission Rate

Each sample was prepared by coating and curing the composition on siliconized PET as described for Example 1. Moisture permeability of each cured adhesive layer was measured by the cup method described in MS Z0208. The oven conditions were 24 hours at 60° C. with relative humidity 90%. The measurement was done twice for each sample and the average value is shown in Table 3.

Visible Light Transmittance

Each sample was prepared by coating and curing the composition on siliconized PET as described for Example 1. A Spectrophotometer U-4100 made by Hitachi was used to measure transmission in the range of from 400 nm to 800 nm. Results are shown in Table 3.

Dynamic Viscoelasticity

The dynamic viscoelastic properties were measured with an ARES rheometer (manufactured by Rheometric Scientific Inc.) at shear mode of 1.0 Hz frequency in the range of from −80° C. to 150° C. For an index of the fluidity, the value of loss tangent tan(δ) (loss modulus G"/storage modulus G') at 80° C. and at 100° C. was measured. Results are shown in Table 3.

Materials

Commercially available materials are described in Table 1 and were used as received.

TABLE 1

| Abreviation | Material |
| --- | --- |
| HCR1 | Hydrogenated cycloaliphatic hydrocarbon resin (ESCOREZ 5340, Exxon Mobil Co., Ltd., Softening Point: 137° C., Mw = 460, Mn = 230, Tg = 85° C.) |
| HCR2 | Aliphatic resin (ESCOREZ 1315, Exxon Mobil Co., Ltd., Softening Point: 115° C., Mw = 2200, Mn = 850, Tg = 60° C.) |
| HCR3 | Non-hydrogenated hydrocarbon resin (ESCOREZ 1310, Exxon Mobil Co., Ltd., Softening Point: 95° C.) |
| PIB 1 | Polyisobutylene resin (OPPANOL B15, BASF Co., Ltd., Mv = 85,000, $MW_w$ = 75,000) |
| PIB 2 | Polyisobutylene resin (OPPANOL B30, BASF Co., Ltd., Mv = 200,000, $MW_w$ = 200,000) |

TABLE 1-continued

| Abreviation | Material |
|---|---|
| PIB 3 | Polyisobutylene resin (OPPANOL B50, BASF Co., Ltd., Mv = 400,000, $MW_w$ = 340,000) |
| PIB 4 | Polyisobutylene resin (OPPANOL B100, BASF Co., Ltd., Mv = 1,100,000, $MW_w$ = 1,100,000) |
| PIB 5 | Polyisobutylene resin (OPPANOL B150, BASF Co., Ltd., Mv = 2,500,000, $MW_w$ = 2,500,000) |
| PIB 6 | Polyisobutylene resin (OPPANOL B10, BASF Co., Ltd., Mv = 40,000, $MW_w$ = 36,000) |
| PIB 7 | Polyisobutylene resin (GLISSOPAL 1000, BASF, Mn = 1000) |
| PIB 8 | Copolymer of isobutylene and isoprene (Butyl 268 from Exxon Mobile, Mooney viscosity = 46-56 at 125 C) |
| Monomer 1 | Tricyclo[5.2.1.0$^{2,6}$]decanedimethanol dimethacrylate (DCP, Shin-Nakamura Chemical Industry, Co., Ltd. or Kowa American) |
| Monomer 2 | Tricyclo[5.2.1.0$^{2,6}$]decanedimethanol diacrylate (SR-833, Sartomer Co., Inc.) |
| Initiator 1 | Photoinitiator (IRGACURE TPO, Ciba Specialty Chemicals, Co., Ltd.) |
| Initiator 2 | Thermal initiator (Dilauroyl peroxide, Wako Chemical Co., Ltd.) |
| Initiator 3 | Thermal initiator (1,1-di(t-hexylperoxy)-3,3,5-trimethylcyclohexane, PERHEXA TMH, NOF Co., Ltd.) |
| Coupling Agent 1 | Methacryloxypropyl methyl dimethoxysilane (KBM502, Shinetsu Chemical Co., Ltd.) |
| Coupling Agent 2 | 3-Mercaptopropyl methyl dimethoxysilane (KBM802, Shinetsu Chemical Co., Ltd.) |
| Coupling Agent 3 | Glycidoxy propyl trimethoxysilane (KBM403, Shinetsu Chemical Co., Ltd.) |
| Filler | Fumed Silica (AEROSIL R972, Nippon Aerosil Co., Ltd) |
| Epoxy Resin 1 | JER1001, Japan Epoxy Resin Co., Ltd |
| Epoxy Resin 2 | JER152, Japan Epoxy Resin Co., Ltd |
| Epoxy Resin 3 | PKHH, Union Carbide Co., Ltd |
| Catalyst | 1-cyano-2-phenyl imidazolium trimaritate (2PZCNS-PW, Shikoku Chemicals Corporation) |

Example 1

The following were dissolved in heptane to give a 45 wt. % solution: 30 g of PIB1, 50 g of HCR1, 20 g of Monomer1, 5 g of Filler, 0.5 g of Initiator 1, and 0.5 g of Coupling Agent 1. This solution was coated on a siliconized PET film (Teijin-DuPont Co., Ltd. A31 38 μm) using a knife coater. Next, it was dried at 90° C. for 30 min and then laminated to siliconized PET film (Teijin-DuPont Co., Ltd. A71 38 μm). The laminate was irradiated with UV rays for 1 minute (F300S (H valve) made by Fusion Co., Ltd., 100 mJ*20 times) and stiffened using an oven at 90° C. for 60 minutes. The thickness of the resulting adhesive layer was 100 μm.

Examples 2-9

Examples 2-9 were prepared as described for Example 1, except that the components shown in Table 2 were used.

Example 10

Example 10 was prepared as described for Example 1, except that the components shown in Table 2 were used. Instead of UV curing, the film was heat cured in an oven at 100° C. for 60 minutes.

Example 11-13

Examples 11-13 were prepared as described for Example 1, except that the components shown in Table 2 were used. Instead of UV curing, the films were heat cured in an oven at 100° C. for 15 minutes.

Comparative Example 1 (C1)

The following were dissolved in methyl ethyl ketone to give a 30 wt. % solution: 35 g of Epoxy Resin 1, 35 g of Epoxy Resin 2, 30 g of Epoxy Resin 3, 5 g of Catalyst, and 1 g of Coupling Agent 3. Instead of UV curing, the film was heat cured in an oven at 100° C. for 180 hours.

Comparative Example 2 (C2)

C2 was prepared as described for Example 1, except that the components shown in Table 2 were used.

TABLE 2

| Ex.[1] | HCR1 (wt. %) | PIB1 (wt. %) | PIB2 (wt. %) | PIB3 (wt. %) | PIB4 (wt. %) | Monomer1 (wt. %) | Initiator | Initiator (wt. %) |
|---|---|---|---|---|---|---|---|---|
| 1[2] | 50 | 30 | | | | 20 | 1 | 0.5 |
| 2 | 50 | | 20 | | | 30 | 1 | 0.5 |
| 3 | 50 | | 30 | | | 20 | 1 | 0.5 |
| 4 | 40 | | 40 | | | 20 | 1 | 0.5 |
| 5 | 50 | 15 | | 15 | | 20 | 1 | 0.5 |
| 6 | 50 | 20 | | 10 | | 20 | 1 | 0.5 |
| 7 | 50 | 25 | | 5 | | 20 | 1 | 0.5 |
| 8 | 50 | 25 | | | 5 | 20 | 1 | 0.5 |
| 9 | 50 | 23 | | | 7 | 20 | 1 | 0.5 |

TABLE 2-continued

| Ex.[1] | HCR1 (wt. %) | PIB1 (wt. %) | PIB2 (wt. %) | PIB3 (wt. %) | PIB4 (wt. %) | Monomer1 (wt. %) | Initiator | Initiator (wt. %) |
|---|---|---|---|---|---|---|---|---|
| 10 | 50 | 25 | | | 5 | 20 | 3 | 1 |
| 11 | 50 | 23 | | | 7 | 20 | 2 | 1 |
| 12 | 50 | 15 | | 15 | | 20 | 2 | 1 |
| 13 | 50 | 25 | | | 5 | 20 | 2 | 1 |
| C2 | 50 | | | | 30 | 20 | 1 | 0.5 |

[1]Each example also contained 0.5 g of Coupling Agent 1 except that Example 5 contained 0.5 g of Coupling Agent 2.
[2]Also contained 5 g of Filler.

TABLE 3

| Ex. | Permeability (g/m² 24 h) | Transmission (% T) | tan($\delta$) at 80° C. | tan($\delta$) at 100° C. | Curing Time (min) | | OLED life |
|---|---|---|---|---|---|---|---|
| 1[2] | 9 | 89 | 1 | 1.0 | 1 | UV | — |
| 2 | 10 | 90 | 1.3 | 1.8 | 1 | UV | 400 h |
| 3 | 8 | 90 | 0.8 | 1.1 | 1 | UV | 660 h |
| 4 | 9 | 90 | 0.7 | 1.0 | 1 | UV | — |
| 5 | 8 | 90 | 0.9 | 1.1 | 1 | UV | — |
| 6 | 8 | 90 | 1.2 | 1.7 | 1 | UV | — |
| 7 | 8 | 90 | 1.6 | 2.3 | 1 | UV | — |
| 8 | 8 | 90 | 0.6 | 0.9 | 1 | UV | — |
| 9 | 8 | 90 | 0.9 | 1.1 | 1 | UV | — |
| 10 | 8 | 91 | 0.6 | 0.9 | 60 | heat | — |
| 11 | 8 | 91 | 0.9 | — | 15 | heat | — |
| 12 | 8 | 91 | 0.9 | — | 15 | heat | — |
| 13 | 8 | 91 | 2 | — | 15 | heat | — |
| C1 | 41 | 89 | 1.1 | 2 | 180 | heat | — |
| C2 | 8 | 90 | 0.22 | 0.27 | 1 | UV | 240 h |

Preparation of OLED Devices

A glass substrate was used as the substrate 1, and a glass substrate with an ITO film (manufactured by Sanyo Vacuum Industries Co., Ltd., ITO film thickness of 150 nm, sheet resistance <14Ω/□, glass thickness of 0.7 mm, dimension of 40 mm×40 mm) was patterned by photolithography to form an ITO electrode pattern. The substrate was surface cleaned by solvent cleaning, and the organic functional and the metal electrode layer were formed on the ITO electrode. The metal electrode layer [an aluminum (purity of 99.99%, manufactured by Kojundo Kasei K.K.) layer 100 nm] was formed.

Next, the film sealing material (thickness 25 micron) was laminated to sealing glass (glass thickness of 0.7 mm, dimension of 30 mm×30 mm). The sealing member and the OLED substrate were opposed to each other in an inert atmosphere of a nitrogen gas from which moisture and oxygen were removed as much as possible, and were laminated by using a vacuum laminator operating at 90° C., 1 N, for 30 minutes. Then the sealed device was cured by F300S (H valve) [made by Fusion Co., Ltd.] at 100 mJ*20 times. The OLED was subjected to a storage test in the air at 60° C. and a relative humidity of 90%. The time until light emission area reduced to 75% of an initial value was recorded. Results are shown in Table 3.

Examples 14-19

Example 14 was prepared and tested as follows. An adhesive comprising PIB8 and HCR1 (70:30 weight ratio) was coated at 25 um (1 mil) thickness on a release liner. The resulting adhesive layer (exposed surface) was transferred to a film comprising a flexible visible light transmissive substrate having alternating polymer and inorganic layers disposed thereon; these films are described in U.S. Pat. No. 7,018,713 B2 (Padiyath et al.). The adhesive and substrate were then baked in vacuum at 80° C. until moisture was removed. Ca (reflective metallic) was coated on a glass substrate and the side with the Ca was disposed on the adhesive layer. The sandwich was laminated. Using a densitometer, optical density was measured at an initial time. The sample was then kept in an environmental chamber for accelerated aging at 60° C./90% relative humidity. For the first 3 days, optical densities were measured twice per day. Optical density was then measured once per day until the density was 50% of the initial density.

Examples 15-17 were prepared and tested as described for Example 14, except that the components shown in Table 4 were used.

Examples 18 and 19 were prepared and tested as described for Example 14, except that the components shown in Table 4 were used. The adhesive was UV cured (3000 mJ/cm²) after lamination.

TABLE 4

| Ex. | HCR1 (wt. %) | HCR2 (wt. %) | HCR3 (wt. %) | PIB4 (wt. %) | PIB8 (wt. %) | Monomer2 (wt. %) | $\Delta$OD After 6 Days |
|---|---|---|---|---|---|---|---|
| 14 | 30 | | | | 70 | | 0.3-0.4 |
| 15 | | 50 | | | 50 | | 0.3-0.4 |
| 16 | | | 50 | 50 | | | 0.3-0.4 |
| 17 | | 30 | | | 70 | | 0.3-0.4 |
| 18[1] | 44.5 | | | 40 | | 15 | 0.4-0.45 |
| 19[1] | | 44.5 | | 40 | | 15 | 0.4-0.45 |

[1]Also contained 0.5 g of Initiator1.

Examples 20-27

Examples 20-23 were prepared and tested as described for Example 14, except that the components shown in Table 5 were used.

Examples 24-28 were prepared and tested as described for Example 14, except that the components shown in Table 5 were used. The adhesive was UV cured (3000 mJ/cm²) after lamination.

TABLE 5

| Ex. | PIB4 (wt. %) | PIB5 (wt. %) | PIB6 (wt. %) | PIB7 (wt. %) | PIB8 (wt. %) | HCR1 (wt. %) | Monomer1 (wt. %) | $\Delta$OD After 6 Days |
|---|---|---|---|---|---|---|---|---|
| 20 | 80 | | 20 | | | | | 0.35-0.45 |
| 21 | 70 | | 30 | | | | | 0.35-0.45 |
| 22 | | 80 | 20 | | | | | 0.35-0.45 |

TABLE 5-continued

| Ex. | PIB4 (wt. %) | PIB5 (wt. %) | PIB6 (wt. %) | PIB7 (wt. %) | PIB8 (wt. %) | HCR1 (wt. %) | Monomer1 (wt. %) | ΔOD After 6 Days |
|---|---|---|---|---|---|---|---|---|
| 23 | | 70 | 30 | | | | | 0.35-0.45 |
| 24[1] | 84.5 | | | | | | 15 | 0.32-0.42 |
| 25[1] | 70 | | | 14.5 | | | 15 | 0.32-0.42 |
| 26[1] | 60 | | | 24.5 | | | 15 | 0.32-0.42 |
| 27[1] | 40 | | | | | 44.5 | 15 | 0.42-0.47 |
| 28[1] | 40 | | | | | 44.5 | 15[2] | 0.42-0.47 |

[1]Also contained 0.5 g of Initiator1.
[2]Monomer2 was used instead of Monomer1.

Examples 29-30

Example 29 was prepared and tested as described for Example 14, except that the components shown in Table 6 were used. The adhesive was UV cured (3000 mJ/cm²) after lamination.

Example 30 was prepared and tested as described for Example 14, except that the components shown in Table 6 were used. The adhesive was thermally cured, after lamination, by heating at 60° C. for 30 minutes.

TABLE 6

| Ex. | PIB4 (wt. %) | HCR1 (wt. %) | Monomer 2 (wt. %) | ΔOD After 4 Days |
|---|---|---|---|---|
| 29[1] | 40 | 44 | 15 | 0.15-0.16 |
| 30[2] | 40 | 44.5 | 15 | 0.15-0.16 |

[1]Also contained 1 g of Initiator 2.
[2]Also contained 0.5 g of Initiator 1.

What is claimed is:

1. An adhesive encapsulating composition for use in an electronic device, comprising:
    a first polyisobutylene resin having a weight average molecular weight of greater than about 300,000 g/mol; and
    a multifunctional (meth)acrylate monomer;
    wherein the adhesive encapsulating composition is substantially free of tackifier.

2. The adhesive encapsulating composition of claim 1, wherein the first isobutylene resin has a weight average molecular weight of greater than about 1,000,000 g/mol.

3. The adhesive encapsulating composition of claim 1, wherein the first polyisobutylene comprises at least about 50 wt. % of the total weight of the adhesive encapsulating composition.

4. An adhesive encapsulating composition for use in an electronic device, comprising:
    a first polyisobutylene resin having a weight average molecular weight of greater than about 300,000 g/mol; and
    a second polyisobutylene resin having a weight average molecular weight of less than about 100,000 g/mol,
    wherein the adhesive encapsulating composition is substantially free of tackifier.

5. The adhesive encapsulating composition of claim 4, wherein the first isobutylene resin has a weight average molecular weight of greater than about 400,000 g/mol.

6. The adhesive encapsulating composition of claim 4, wherein the first polyisobutylene comprises at least about 50 wt. % of the total weight of the adhesive encapsulating composition.

7. The adhesive encapsulating composition of claim 4, further comprising a multifunctional (meth)acrylate monomer.

8. The adhesive encapsulating composition of claim 7, comprising:
    from about 50 to about 80 wt. % of the first polyisobutylene resin;
    from about 10 to about 30 wt. % of the second polyisobutylene resin; and
    from about 10 to about 20 wt. % of the multifunctional (meth)acrylate monomer;
    all relative to the total weight of the adhesive encapsulating composition.

9. An adhesive encapsulating composition for use in an electronic device, comprising:
    a second polyisobutylene resin having a weight average molecular weight of less than about 300,000 g/mol;
    a multifunctional (meth)acrylate monomer; and
    a tackifier,
    wherein the adhesive encapsulating composition is free of a first polyisobutylene having a weight average molecular weight of greater than about 300,000 g/mol.

10. The adhesive encapsulating composition of claim 9, wherein the second isobutylene resin has a weight average molecular weight of less than about 100,000 g/mol.

11. The adhesive encapsulating composition of claim 9, comprising:
    from about 10 to about 50 wt. % of the second polyisobutylene resin;
    from about 10 to about 40 wt. % of the multifunctional (meth)acrylate monomer;
    from about 30 to about 60 wt. % of the tackifier;
    all relative to the total weight of the adhesive encapsulating composition.

12. An adhesive encapsulating composition for use in an electronic device, comprising:
    a first polyisobutylene resin having a weight average molecular weight of greater than about 300,000 g/mol, wherein the first polyisobutylene resin comprises 20 wt. % or less of the total weight of the adhesive encapsulating composition;
    a second polyisobutylene resin having a weight average molecular weight of less than about 300,000 g/mol;
    a multifunctional (meth)acrylate monomer; and
    a tackifier.

13. The adhesive encapsulating composition of claim 12, wherein the first isobutylene resin has a weight average molecular weight of greater than about 1,000,000 g/mol.

14. The adhesive encapsulating composition of claim 12, comprising:
    from about 10 to about 30 wt. % of the second polyisobutylene resin;

from about 10 to about 30 wt. % of the multifunctional (meth)acrylate monomer;

from about 40 to about 60 wt. % of the tackifier;

all relative to the total weight of the adhesive encapsulating composition.

15. The adhesive encapsulating composition of claim 1, wherein the multifunctional (meth)acrylate monomer comprises an aliphatic di(meth)acrylate.

16. The adhesive encapsulating composition of claim 1, wherein the multifunctional (meth)acrylate monomer comprises a multifunctional (meth)acrylate/epoxy monomer.

17. The adhesive encapsulating composition of claim 1, wherein the adhesive encapsulating composition is photopolymerizable and comprises a photoinitiator.

18. The adhesive encapsulating composition of claim 1, wherein the adhesive encapsulating composition is thermally polymerizable and comprises a thermal initiator.

19. The adhesive encapsulating composition of claim 1, further comprising particles.

20. An adhesive encapsulating film comprising an adhesive layer disposed on a substrate, the adhesive layer comprising the adhesive encapsulating composition of claim 1.

21. An adhesive encapsulating film comprising an adhesive layer disposed on a substrate, and a gas-barrier film disposed on the adhesive layer opposite the substrate, the adhesive layer comprising the adhesive encapsulating composition of claim 1.

22. An adhesive encapsulating film comprising an adhesive layer disposed on a substrate, and a trapping layer disposed either on the adhesive layer opposite the substrate or between the adhesive layer and the substrate, the adhesive layer comprising the adhesive encapsulating composition of claim 1.

23. An organic electroluminescent device comprising:
a pair of opposing electrodes;
a light-emitting unit having at least an organic light-emitting layer, the light-emitting unit disposed between the pair of opposing electrodes; and
an adhesive encapsulating composition disposed on, above, or around the light-emitting unit, the adhesive encapsulating composition comprising:
a first polyisobutylene resin having a weight average molecular weight of greater than about 300,000 g/mol; and
a multifunctional (meth)acrylate monomer;
wherein the adhesive encapsulating composition is substantially free of tackifier.

24. The organic electroluminescent device of claim 23, wherein the device is flexible.

25. A touch screen comprising:
a glass or polymeric substrate;
a substantially transparent conductive metal disposed on the substrate; and
an adhesive encapsulating composition disposed on, above, or around the metal, the adhesive encapsulating composition comprising:
a first polyisobutylene resin having a weight average molecular weight of greater than about 300,000 g/mol; and
a multifunctional (meth)acrylate monomer;
wherein the adhesive encapsulating composition is substantially free of tackifier.

26. A photovoltaic device comprising:
a photovoltaic cell or an array of photovoltaic cells; and
an adhesive encapsulating composition disposed on, above, or around the photovoltaic cell or any one of the photovoltaic cells of the array of photovoltaic cells, the adhesive encapsulating composition comprising:
a first polyisobutylene resin having a weight average molecular weight of greater than about 300,000 g/mol; and
a multifunctional (meth)acrylate monomer;
wherein the adhesive encapsulating composition is substantially free of tackifier.

27. A thin film transistor comprising:
a semiconductor layer; and
an adhesive encapsulating composition disposed on, above, or around the semiconductor layer, the adhesive encapsulating composition comprising:
a first polyisobutylene resin having a weight average molecular weight of greater than about 300,000 g/mol; and
a multifunctional (meth)acrylate monomer;
wherein the adhesive encapsulating composition is substantially free of tackifier.

* * * * *

UNITED STATES PATENT AND TRADEMARK OFFICE
CERTIFICATE OF CORRECTION

PATENT NO. : 8,232,350 B2
APPLICATION NO. : 12/995565
DATED : July 31, 2012
INVENTOR(S) : Jun Fujita et al.

It is certified that error appears in the above-identified patent and that said Letters Patent is hereby corrected as shown below:

Column 5
Lines 44-45; Delete "tetramethylpiperidiyl" and insert -- tetramethylpiperidinyl --, therefor.
Line 45; Delete "pentamethylpiperidiyl" and insert -- pentamethylpiperidinyl --, therefor.

Column 7
Line 49; Delete "phospine" and insert -- phosphine --, therefor.
Line 59; Delete "(Rodia" and insert -- (Rhodia --, therefor.
Line 60; Delete "Specitalies)." and insert -- Specialties). --, therefor.

Column 9
Line 45; Delete "that the it" and insert -- that it --, therefor.
Line 58; Delete "dessicant" and insert -- desiccant --, therefor.

Column 10
Line 2; Delete "dispersability" and insert -- dispersibility --, therefor.
Line 44; Delete "Shinestsu" and insert -- Shinetsu --, therefor.
Line 45; Delete "Shinestsu" and insert -- Shinetsu --, therefor.
Line 47; Delete "Shinestsu" and insert -- Shinetsu --, therefor.

Column 11
Line 36; Delete "backing" and insert -- backing. --, therefor.

Column 14
Line 13; Delete "porphryin" and insert -- porphyrin --, therefor.
Line 40; Delete "tert." and insert -- tert --, therefor.
Line 55; Delete "aencapsulating" and insert -- encapsulating --, therefor.

Column 17-18
Line 1 (Table 1); Delete "Abreviation" and insert -- Abbreviation --, therefor.

Signed and Sealed this
Second Day of April, 2013

Teresa Stanek Rea
*Acting Director of the United States Patent and Trademark Office*

CERTIFICATE OF CORRECTION (continued)
U.S. Pat. No. 8,232,350 B2

<u>Column 18</u>
Line 34; Delete "MS" and insert -- JIS --, therefor.

<u>Column 19-20</u>
Line 1 (Table 1-continued); Delete "Abreviation" and insert -- Abbreviation--, therefor.